(12) United States Patent
Hurley et al.

(10) Patent No.: US 6,535,092 B1
(45) Date of Patent: Mar. 18, 2003

(54) DEVICE FOR GENERATING A VARIABLE MAGNETIC FIELD

(75) Inventors: David Patrick Hurley, Dublin (IE); John Michael David Coey, Dublin (IE)

(73) Assignee: Magnetic Solutions (Holdings) Limited, Dublin (IE)

(*) Notice: Subject to any disclaimer, the term of this patent is extended or adjusted under 35 U.S.C. 154(b) by 0 days.

(21) Appl. No.: 10/088,570

(22) PCT Filed: Sep. 21, 2000

(86) PCT No.: PCT/IE00/00109
§ 371 (c)(1),
(2), (4) Date: Jun. 20, 2002

(87) PCT Pub. No.: WO01/22441
PCT Pub. Date: Mar. 29, 2001

(30) Foreign Application Priority Data

Sep. 21, 1999 (IE) ............................................ S990787

(51) Int. Cl.[7] ................................................. H01F 7/02
(52) U.S. Cl. ...................... 335/306; 335/298; 117/917
(58) Field of Search ...................... 335/216, 296–306; 324/318, 319, 320; 117/917

(56) References Cited

U.S. PATENT DOCUMENTS 4,538,130 A * 8/1985 Gluckstern et al. .. 250/396 ML
4,758,813 A    7/1988 Holsinger et al.
5,237,301 A * 8/1993 Unkelbach et al. ......... 335/302
5,519,373 A * 5/1996 Miyata ........................ 335/306
5,523,732 A * 6/1996 Leupold ...................... 335/298
6,014,943 A * 1/2000 Arami et al. ............ 118/723 E

FOREIGN PATENT DOCUMENTS

DE    43 29 960 A    3/1995
JP    59 121183 A    7/1984

* cited by examiner

Primary Examiner—Ramon M. Barrera
(74) Attorney, Agent, or Firm—Sughrue Mion, PLLC

(57) ABSTRACT

A device (1) for generating a variable composite magnetic field comprises top and bottom concentric ring members (3, 4) which define a main central axis (5) and a central area (4) within which the composite magnetic filed is formed. Rod-like permanent magnets are located thin respective annuli (15) of the respective ring members (2, 3), and are equi-spaced circumferentially along a pitched circle (21). The permanent magnets (18) are rotable about corresponding secondary axes (19) which extend parallel to each other and parallel to the main central axis (5). The permanent magnets (18) are magnetised with their respective direction of magnetisation extending transversely of their secondary axes (19) and are independently rotatable by corresponding stepper motors (22) in respective of annuli (16) of the ring members (2, 3) for orienting the permanent magnets (18) about their respective secondary axes (19) for in turn altering the composite magnetic field generated in the central area (4).

34 Claims, 8 Drawing Sheets

DIPOLE FIELD

MULTIPOLE FIELD: ZY PLANE

DEVICE FOR GENERATING A VARIABLE MAGNETIC FIELD

This is a National stage entry under 35 U.S.C. §371 of Application No. PCT/IE00/00109 filed Sep. 21, 2000; the disclosure of which is incorporated herein by reference.

BACKGROUND OF THE INVENTION

The present invention relates to a device for generating a variable magnetic field, and in particular, though not limited to a device for generating a magnetic field of variable direction.

Many manufacturing processes require that the manufacturing process be carried out in a magnetic field. Magnetic fields are also required in the field of medical healthcare, and in particular, in the field of medical diagnostics, for example, in NMR scanners.

In the semiconductor industry semiconductor substrates are formed from single large silicon crystals which are grown from an electrically conductive melt in relatively strong magnetic fields. In general, single crystal silicon from which semiconductor substrates for use in semiconductor chips are formed are in the form of circular wafers cut from boules grown by a method known as the Czochralski method. The current trend in the formation of such wafers is towards wafers of ever increasing diameter. The industry standard has progressed from four inch through six inch to eight inch diameter wafers, and now twelve inch and even greater diameter wafers are envisaged. Semiconductor materials other than silicon are also grown by the Czochralski method, such as germanium, silicon-germanium alloys, gallium arsenide, indium antimonide and other Class III-V or II-VI compounds. Other methods of growing semiconductor crystals from a melt include methods which are referred to as the floating-zone and Bridgeman methods for forming circular boules, as well as the dendritic-web method for forming flat strip material.

During crystal growth it is important to control parameters in the melt such as the crystal orientation, thermal flux, rotation and pull rates, convection in the molten bath and distribution of impurities in the crystal. In order to stabilise the convective flow pattern in the electrically conducting melt and to dampen oscillations, as well as to achieve a uniform, low and radially homogeneous distribution of impurities, such as, oxygen, large diameter pure boules of silicon are grown from the melt in a magnetic field. In general, three magnetic field patterns are used in the commercial growing of semiconductor crystals, these are:

(i) a transverse field,
(ii) an axial field, and
(iii) a cusp field.

The effects of these three field configurations in the growth of semiconductor crystals is discussed in an article entitled "Use of a Magnetic Field in Melt Growth" by DTJ Hurle and R W Series in the "Handbook of Crystal Growth, volume 2A", Chapter 5 published by North Holland, Amsterdam in 1994. Suitable magnetic fields have been produced by devices which comprise electromagnets or Helmholz coils. However, the physical size of the device must be such as to accommodate the growing crystal, the melt and an associated furnace. Electromagnets are bulky and require continuous expenditure of energy to drive the current in the excitation coils required to produce the necessary magnetic flux. Helmholz coils suffer from similar disadvantages. Additionally, a cooling system is required in order to remove the heat generated in electrically resistive coils, and in super conducting coils continuous cooling is required in order to maintain the super conductor below its super conducting transition temperature.

Additionally, in practice it is not possible to predict the precise effect of a magnetic field on crystal growth from first principles, and thus, it is necessary to proceed empirically to optimise the magnitude and direction of the field, as well as the field profile. Indeed, in many instances, different field conditions are required during the growth process of the crystal, for example, a magnetic field which is suitable for the early stage of the growth may not be suitable for the middle stage, and similarly, the latter stage of the crystal growth may require a further different magnetic field. While it is possible to vary the magnitude of the field produced by devices comprising electromagnets and Helmholz coils by varying the electric current, there is only limited scope for varying the field profile and direction in such devices.

There is therefore a need for a device for generating a variable magnetic field, and there is also a need for a device for generation a variable magnetic field which in particular is suitable for use in the semiconductor industry for growing large single crystal silicon from a melt. Indeed, there is also a need for a device for generating a variable magnetic field for use in other industrial applications, for example, in the melt growth of metals by techniques such as jet casting, where a magnetic field is used to stabilise a molten jet of metal, and also, in the medical and medical diagnostic field.

SUMMARY OF THE INVENTION

The present invention is directed towards providing a device for generating a variable magnetic field.

According to the invention there is provided a device for generating a variable composite magnetic field, the device comprising a ring member defining a main central axis and a central area around the central axis within which the composite magnetic field is generated, a plurality of discrete magnetic field generating means for generating respective magnetic fields mounted at spaced apart intervals around the ring member for generating the composite magnetic field in the central area, wherein the respective magnetic field generating means are orientably mounted on the ring member for varying the orientations of the magnetic fields generated by the magnetic field generating means for varying the composite magnetic field, and a means is provided for varying the orientations of the magnetic field generating means and for retaining the magnetic field generating means in desired orientations.

In one embodiment of the invention each magnetic field generating means defines a corresponding secondary axis.

In another embodiment of the invention the respective magnetic field generating means are mounted on the ring member with their respective secondary axes extending parallel to each other and parallel to the main central axis.

In a further embodiment of the invention the respective magnetic field generating means are mounted on the ring member with their respective secondary axes located on a common pitch circle, the centre of which coincides with the main central axis.

Preferably, the respective magnetic field generating means are mounted with their secondary axes equi-spaced apart circumferentially around the main central axis. Advantageously, each magnetic field generating means generates a magnetic field extending transversely of its corresponding secondary axis. Preferably, each magnetic field generating means generates a magnetic field extending perpendicularly to its corresponding secondary axis. Ideally, each magnetic field generating means is magnetised such that its direction of magnetisation extends transversely of its secondary axis.

In one embodiment of the invention each magnetic field generating means is rotatably mounted about its secondary axis for varying the orientation of the magnetic field generated by the magnetic field generating means (18) relative to the main central axis.

In another embodiment of the invention the means for orienting each magnetic field generating means rotates the respective magnetic field generating means about their respective secondary axes. Preferably, a plurality of means for orienting the magnetic field generating means are provided, one orienting means being provided for each magnetic field generating means. Advantageously, each orienting means comprises an electrically powered motor. Preferably, each electrically powered motor is a stepper motor.

In one embodiment of the invention a monitoring means is provided for determining the angular position of each magnetic field generating means about its secondary axis, and the orienting means is responsive to the monitoring means for orienting the magnetic field generating means.

Preferably, the monitoring means comprises a plurality of angular position determining encoders, one encoder being provided for each magnetic field generating means.

In another embodiment of the invention a retaining means is provided for retaining each magnetic field generating means in any one of a plurality of orientations.

Preferably, a plurality of retaining means are provided, one retaining means being provided associated with each magnetic field generating means. Advantageously, each retaining means comprises the stepper motor corresponding to the magnetic field generating means.

Preferably, each magnetic field generating means is independently orientatable relative to the other magnetic field generating means.

Advantageously, each magnetic field generating means comprises a permanent magnet.

Advantageously, each magnetic field generating means is provided by a rod-shaped permanent magnet.

Preferably, the secondary axis of each rod-shaped permanent magnet is defined by the longitudinal geometrical central axis of the rod-shaped permanent magnet.

Advantageously, each rod-shaped permanent magnet is of circular transverse cross-section.

In one embodiment of the invention each permanent magnet is of a high coercivity grade material.

In another embodiment of the invention each permanent magnet is of a rare-earth material.

In a further embodiment of the invention at least two ring members are provided, the ring members being co-axially arranged with their respective main central axis coinciding with each other.

Preferably, the respective ring members are arranged side by side axially along the main central axis.

Advantageously, the respective ring members are of similar diameter.

In one embodiment of the invention the respective ring members are arranged for axially abutting each other.

Preferably, the pitch circle diameters of the respective ring members along which the corresponding magnetic field generating means are located are of similar diameter.

Advantageously, each ring member is of circular shape.

In one embodiment of the invention each ring member comprises at least eight magnetic field generating means.

Further the invention provides a method for generating a variable composite magnetic field using the device according to the invention, wherein the method comprises orienting the respective magnetic field generating means located on each ring member to an orientation for generating the composite magnetic field of the desired type and direction.

Additionally, the invention provides a method for growing a semiconductor crystal using the device according to the invention wherein the crystal being grown is grown in the composite magnetic field.

The advantages of the invention are many. The device according to the invention allows the composite magnetic field generated by the device to be varied readily and easily. All that is required is to orient the magnetic field generating means in order to vary the composite magnetic field generated by the device. By virtue of the fact that the device generates the composite magnetic field in a central area around the main central axis defined by the ring member, the device according to the invention is particularly suitable for use in industrial and indeed medical fields. In particular, the devices particularly suitable for use in industrial manufacturing processes where a magnetic field is required during the carrying out of the manufacturing process, and in particular, where it is desired to vary parameters of the magnetic field during the manufacturing process, such as, for example, in the growth of large, pure single crystal semiconductors. By virtue of the fact that the orientation of the magnetic fields generated by the respective magnetic field generating means can be independently orientated both the orientation and the profile or type of the composite magnetic field can readily easily be varied. Indeed the strength of the composite magnetic field can also be varied. Needless to say, the advantages which are derived from the device according to the invention are equally beneficial in the application of the device to other industrial processes, medical diagnostic applications, as well as medical therapeutic methods.

BRIEF DESCRIPTION OF THE DRAWINGS

The invention will be more clearly understood from the following description of some preferred embodiments thereof, which are given by way of example only, with reference to the accompanying drawings, in which.

Figure 1:
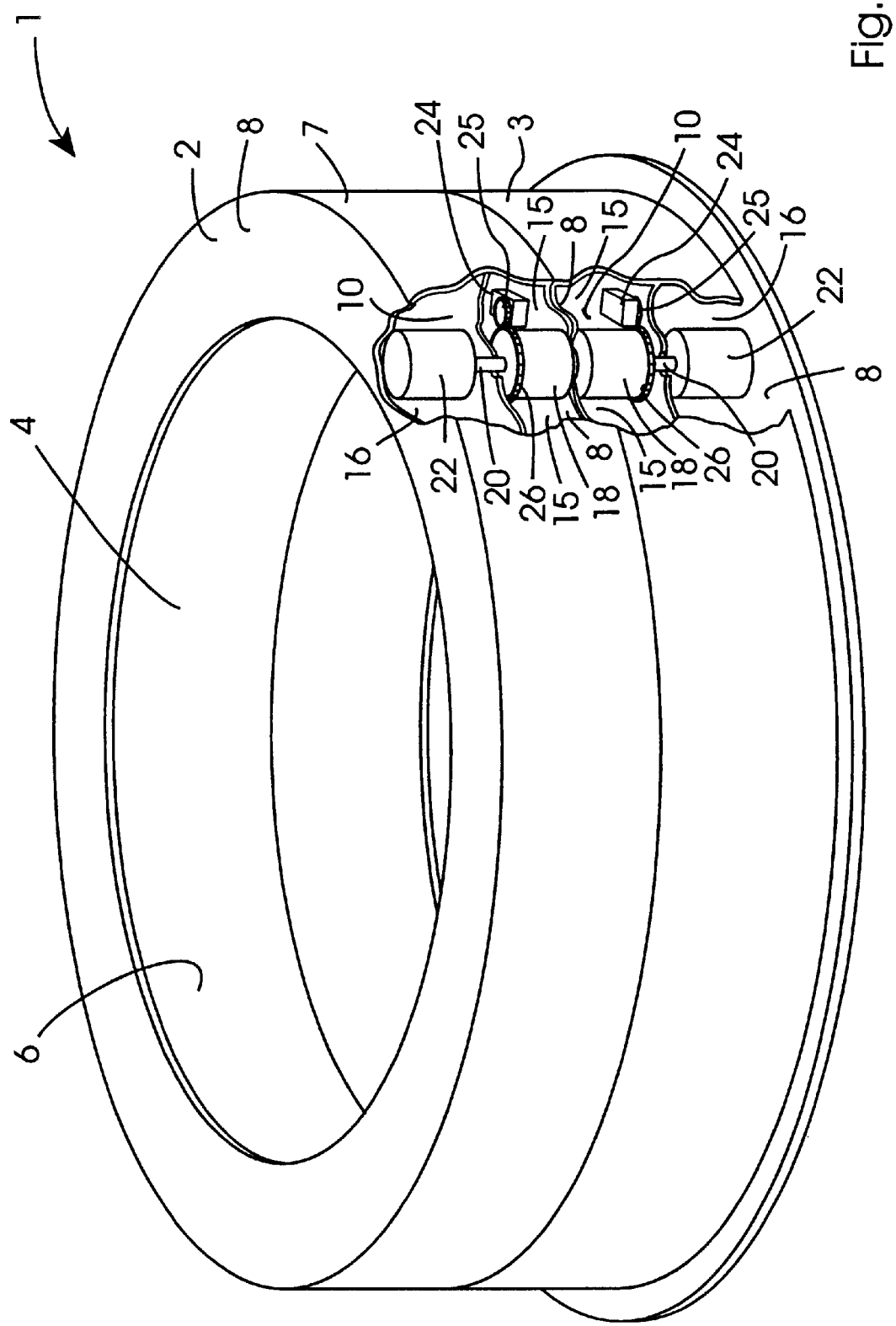
FIG. 1 is a partly cut away perspective view of a device according to the invention for generating a variable composite magnetic field.
Figure 2:
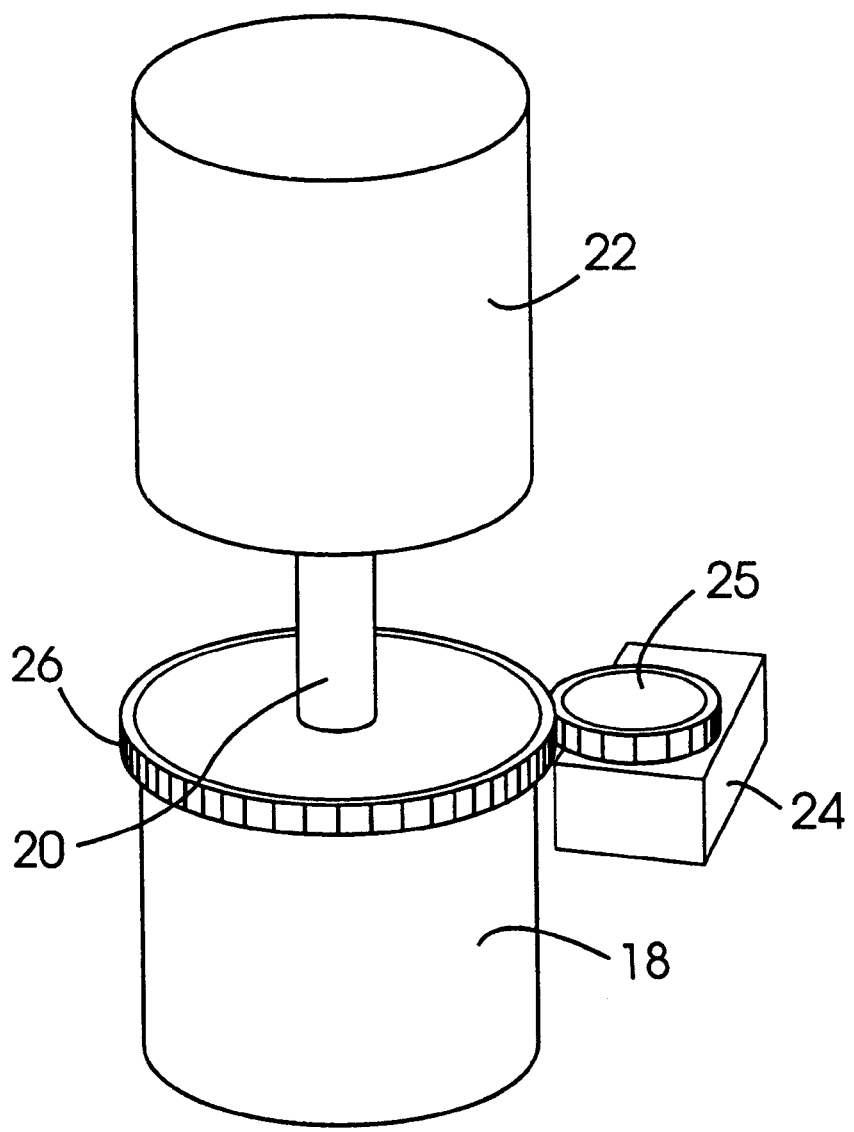
FIG. 2 is a perspective view of a detail of the device of FIG. 1.
Figure 3:
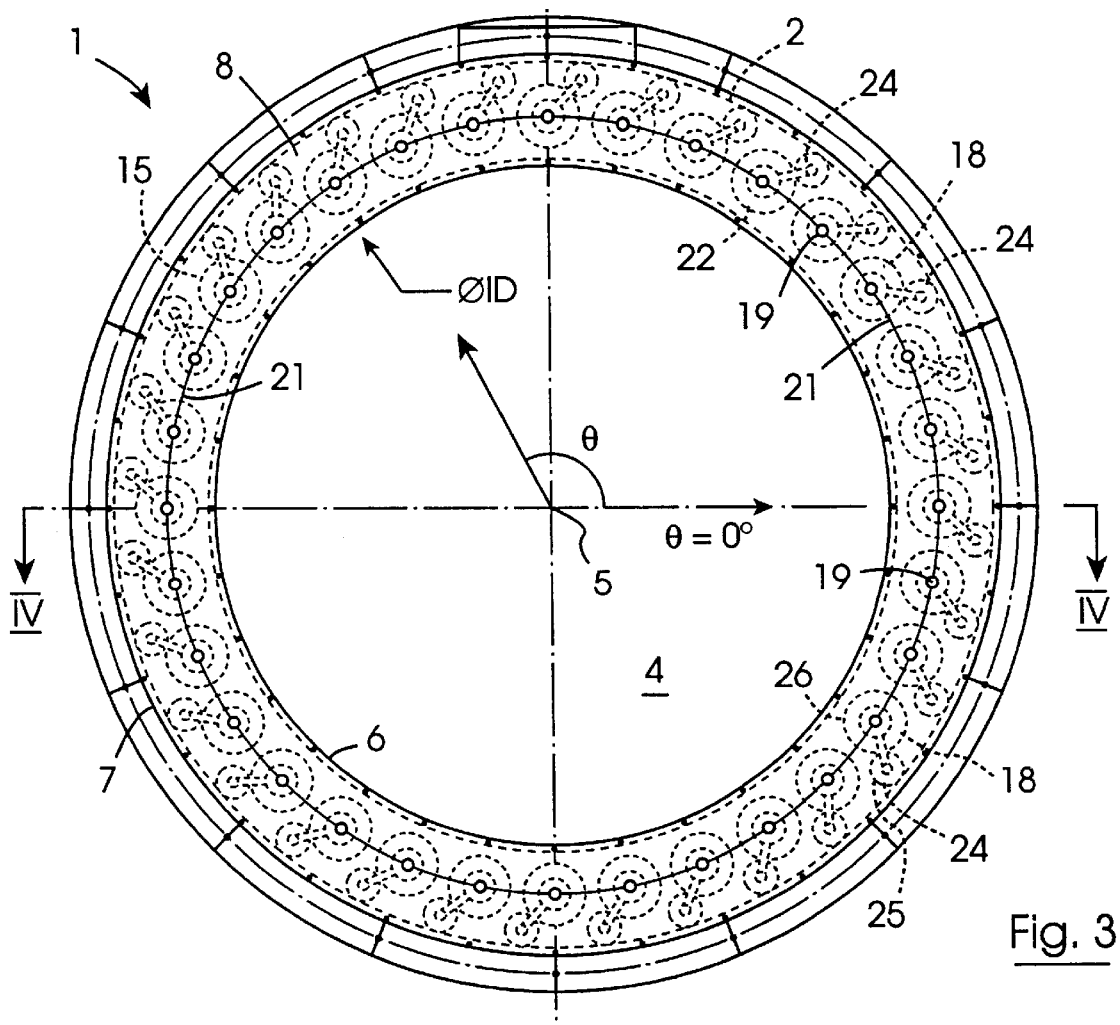
FIG. 3 is a plan view of the device of FIG. 1.
Figure 4:
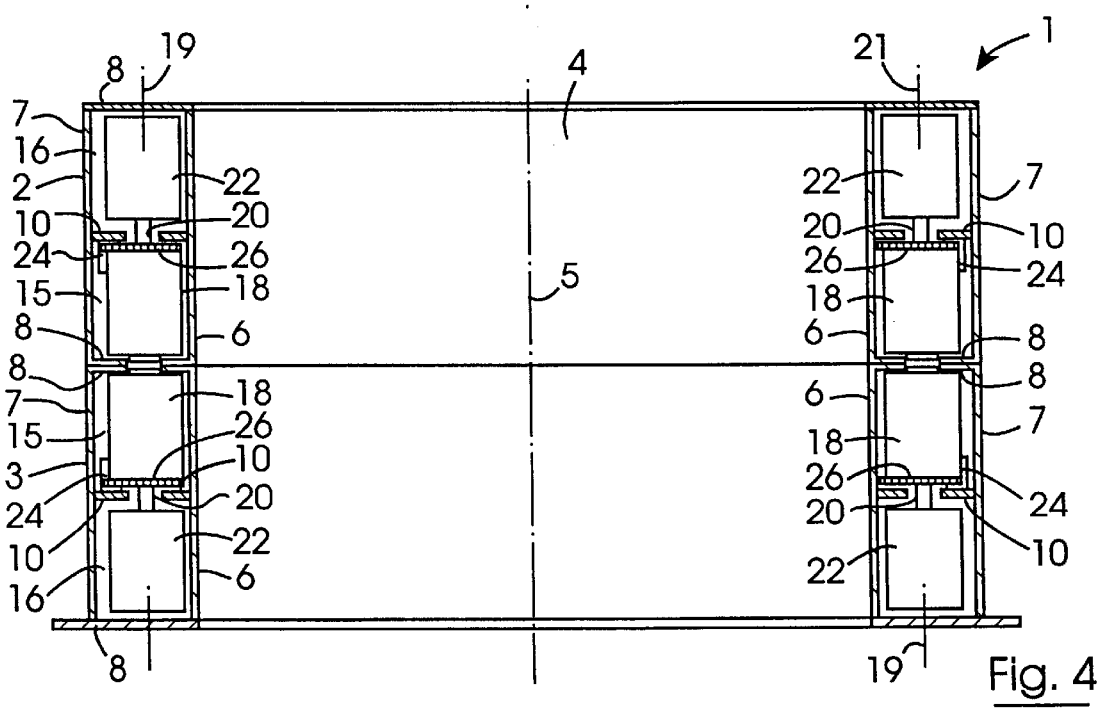
FIG. 4 is a transverse cross-sectional side elevational view of the device of FIG. 1 on the line III—III of FIG. 3, FIGS. 5(a) to (d) are diagrammatic plan views of the device of FIG. 1 illustrating different composite magnetic fields which may be generated by the device of FIG. 1, FIGS. 6(a) to (d) are diagrammatic cross-sectional side elevational views of the device of FIG. 1 on the lines VI—VI of FIGS. 5(a) to (d), illustrating the composite magnetic fields on the lines VI—VI of FIGS. 5(a) to (d), respectively.

Referring to the drawings, and initially to FIGS. 1 to 4, there is illustrated a device according to the invention indicated generally by the reference numeral 1 for generating a variable composite magnetic field, which is particularly suitable for use in the growing of large pure silicon crystals in the semiconductor industry or in the manufacture of metals. The device 1 in this embodiment of the invention comprises a pair of circular ring members, namely, a top ring member 2 and a bottom ring member 3 which abut each other axially, and are of similar diameter and radial width in plan view. The ring members 2 and 3 define a main central area 4 within which the composite magnetic field is generated, and a main central axis 5 which extends centrally through the central area 4. Each ring member 2 and 3 comprises an inner cylindrical shell 6 and an outer cylindrical shell 7 which are joined by outer radial annular walls 8. Intermediate annular walls 10 extend between the inner and outer shells 6 and 7 of each ring member 2 and 3 and are located intermediate the outer annular walls 8 for defining with the respective inner and outer shells 6 and 7 and the outer annular walls 8 respective annuli 15 and 16. The inner shells 6 of the respective ring members 2 and 3 define the central area 4 which is of cylindrical shape and extends around the main central axis 5.

A plurality of magnetic field generating means, in this embodiment of the invention provided by permanent magnets 18 are located and equi-spaced apart circumferentially in the annulus 15 of each ring member 2 and 3 for generating the composite magnetic field. The permanent magnets 18 are of rod-shape construction of circular transverse cross-section, and are rotatable about respective secondary axes 19 which are defined by their respective central longitudinal geometrical axes. Shafts 20 extend co-axially from respective opposite ends of the permanent magnets 18 and rotatably engage bearings (not shown) in the corresponding outer annular wall 8 and the intermediate annular wall 10 for rotatably carrying the permanent magnets 18 in the respective annuli 15. The permanent magnets 18 are located within the corresponding annuli 15 with their respective secondary axes 19 extending parallel to each other and parallel to the main central axis 5. Additionally, the permanent magnets 18 are located within the respective annuli 15 in pairs such that the permanent magnets in the respective annuli 15 which are adjacent each other are arranged with their respective secondary axes 19 co-axially with each other. In other words, each permanent magnet 18 in the top ring member 2 is aligned with a corresponding permanent magnet 18 in the bottom ring member 3, such that the aligned permanent magnets 18 form a pair which are aligned with their respective secondary axes 19 coinciding with each other. Additionally, the permanent magnets 18 are located within the respective annuli 15 with their secondary axes 19 equi-spaced circumferentially around a common pitch circle 21, the diameter of the pitch circle 21 being identical for the respective top and bottom ring members 2 and 3. The permanent magnets 18 are magnetised such that the direction of magnetisation of the permanent magnets 18 extends radially across the permanent magnets 18 perpendicularly to their respective secondary axes 19. Accordingly, the permanent magnets 18 generate magnetic fields which extend transversely of their respective secondary axes 19.

An orienting means for independently angularly orienting the permanent magnets 18, and in turn, the orientation of their respective magnetic fields about their respective secondary axes 19 in this embodiment of the invention comprises a plurality of electrically powered stepper motors 22. The stepper motors 22 are located in the corresponding annuli 16, and one stepper motor 22 is provided for each permanent magnet 18 for rotating the corresponding permanent magnet 18 through the corresponding shaft 20. The permanent magnets 18 are independently rotatable by the stepper motors 22 for varying the direction, type and strength of the composite magnetic field generated in the central area 4.

A means for monitoring the angular orientation of the respective permanent magnets 18 comprise a plurality of encoders 24, one encoder being provide for each permanent magnet 18. A pinion 25 of each encoder 24 is driven by a corresponding ring gear 26 rigidly secured to the shaft 20 of corresponding permanent magnet 18 for monitoring angular rotation of the corresponding permanent magnet 18 about its secondary axis 19. The encoders 24 are located in the annuli 15 along with the permanent magnets 18.

Control circuitry (not shown) reads signals from the encoders 24 for determining the angular orientations of the respective permanent magnets 18, and the stepper motors 22 are operated under the control of the control circuitry (not shown) for rotating the permanent magnets 18 into the desired and appropriate angular orientations for generating the desired composite magnetic field in the central area 4. In this embodiment of the invention, the respective stepper motors act as respective retaining means for retaining the permanent magnets 18 in the appropriate orientations for generating the desired composite magnetic field.

Any number of permanent magnets may be provided, and in general, the number of permanent magnets will be dictated by the diameter of the ring members 2 and 3, the diameter of the permanent magnets 18 and the strength of the magnetic field required. Preferably, an even number of permanent magnets should be provided, and while in theory there is no upper limit on the number of permanent magnets, in practice, it is envisaged that the maximum number of permanent magnets, in general, will not exceed 96. However, in order to generate composite magnetic fields of desirable strength, in general, it is envisaged that at least eight permanent magnets 18 in each ring member 2 and 3 will be required at equi-spaced intervals around the respective ring members. In this embodiment of the invention, thirty-two permanent magnets are equi-spaced around the main central axis 5 along the pitch circle 21 in each ring member 2 and 3.

The length and diameter of the permanent magnets 18 will vary depending on the size of the device, the strength of the magnetic field required and the application to which the composite magnetic field is to be put, however, in the case of a device for generating a magnetic field for use in a growing process for growing semiconductor crystals where the diameter of the pitch circle 21 would typically be of the order of 0.25 to 1.5 meters, typically 32 permanent magnets 18 would be provided in each of the ring members 2 and 3 and the axial length of the permanent magnets 18 along their respective secondary axes would be in the range of 0.1 to 1.0 times the pitch circle diameter. The diameters of the respective permanent magnets 18 would be in the order of 1 cm to 10 cm.

The permanent magnets 18 may be of any suitable material, but typically where it is desired to generate a composite magnetic field for use in the growing of semiconductor crystals, the permanent magnets will be of high-coercivity grade material such as hexagonal ferrite, neodymium-iron-boron, samarium-cobalt, samarium-iron-nitrogen or other rate-earth permanent magnet. The permanent magnets 18 may be entirely composed of these materials in sintered or bonded form, or the magnets 18 may be fixed in tubes made of steel or non-magnetic material.

Figure 5:
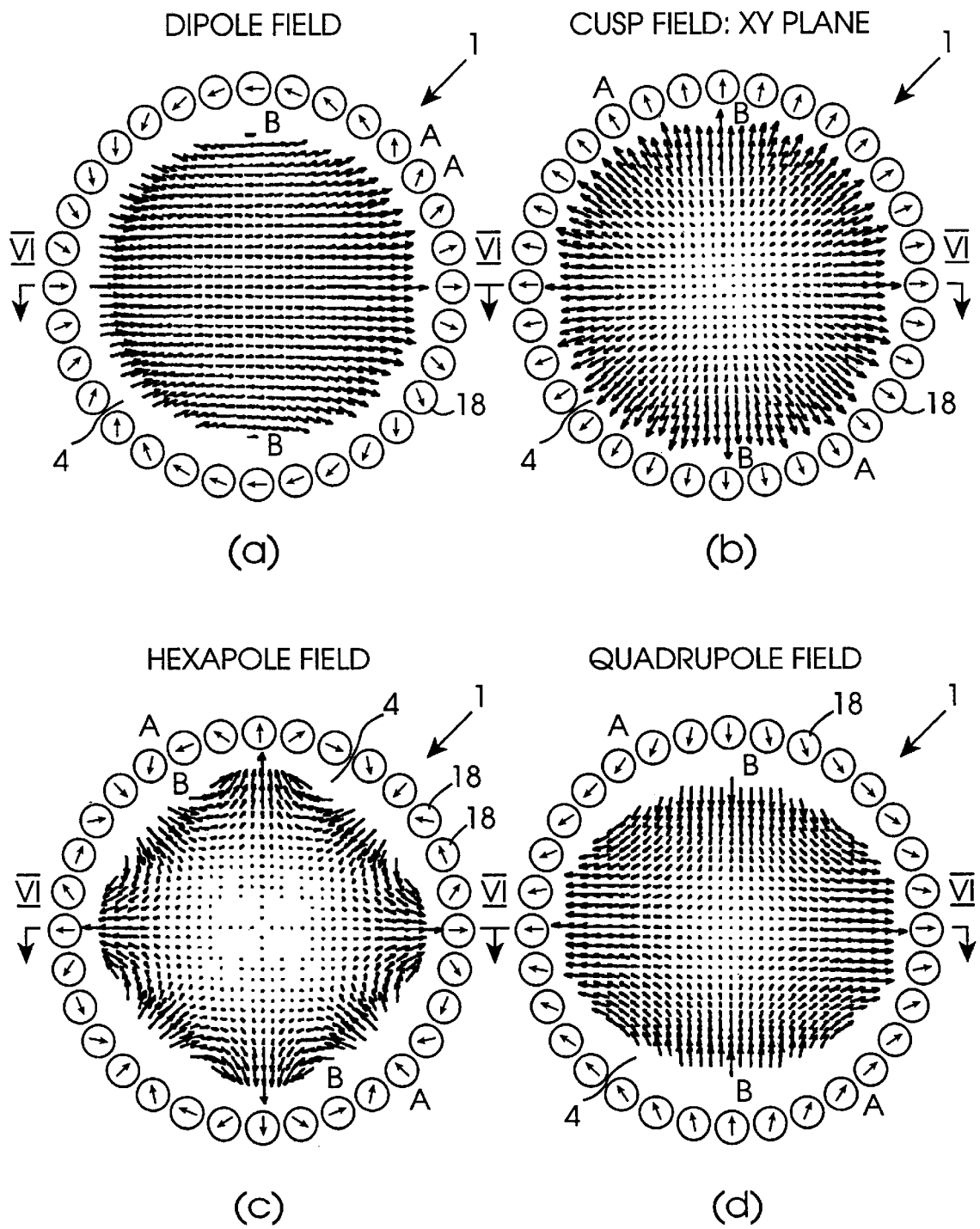

Referring now to FIGS. 5 and 6, four different types of composite magnetic fields which may be generated in the central area 4 of the device 1 are illustrated. In FIGS. 5(a) to (d), the orientation of the permanent magnets 18 of the top ring member 2 are illustrated. The direction of magnetisation of the permanent magnets 18 of the top ring member 2 are indicated by the arrows A in FIGS. 5(a) to (d) in order to generate the respective composite magnetic fields. The direction of the magnetic flux of the composite magnetic field generated by the respective permanent magnets 18 is illustrated by the arrows B in FIGS. 5 and 6.

Figure 6A:
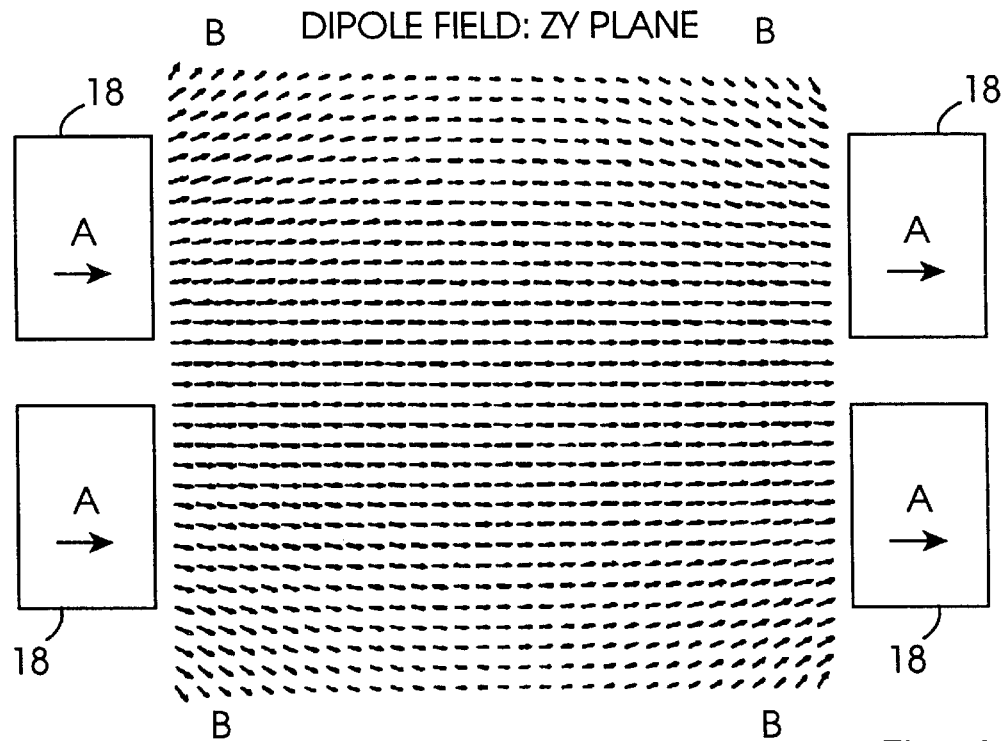
FIG. 6(e) is a diagrammatic cross-sectional side elevational view of the device of FIG. 1 on the lines VI—VI of FIG. 5(b) illustrating another composite magnetic field on the lines VI—VI of FIG. 5(b)

In FIGS. 5(a) and 6(a), the permanent magnets 18 are oriented for generating a dipole composite magnetic field extending transversely across the central area 4. In this case the permanent magnets 18 in the top and bottom ring members 2 and 3 are oriented so that the respective direction of magnetisation of each aligned pair of permanent magnets 18 in the top and bottom ring members 2 and 3 extend in the same direction, see FIG. 6(a). Accordingly, the magnetic flux of the composite dipole magnetic field essentially flows across the central area 4 from one side to the other.

Figure 6C:
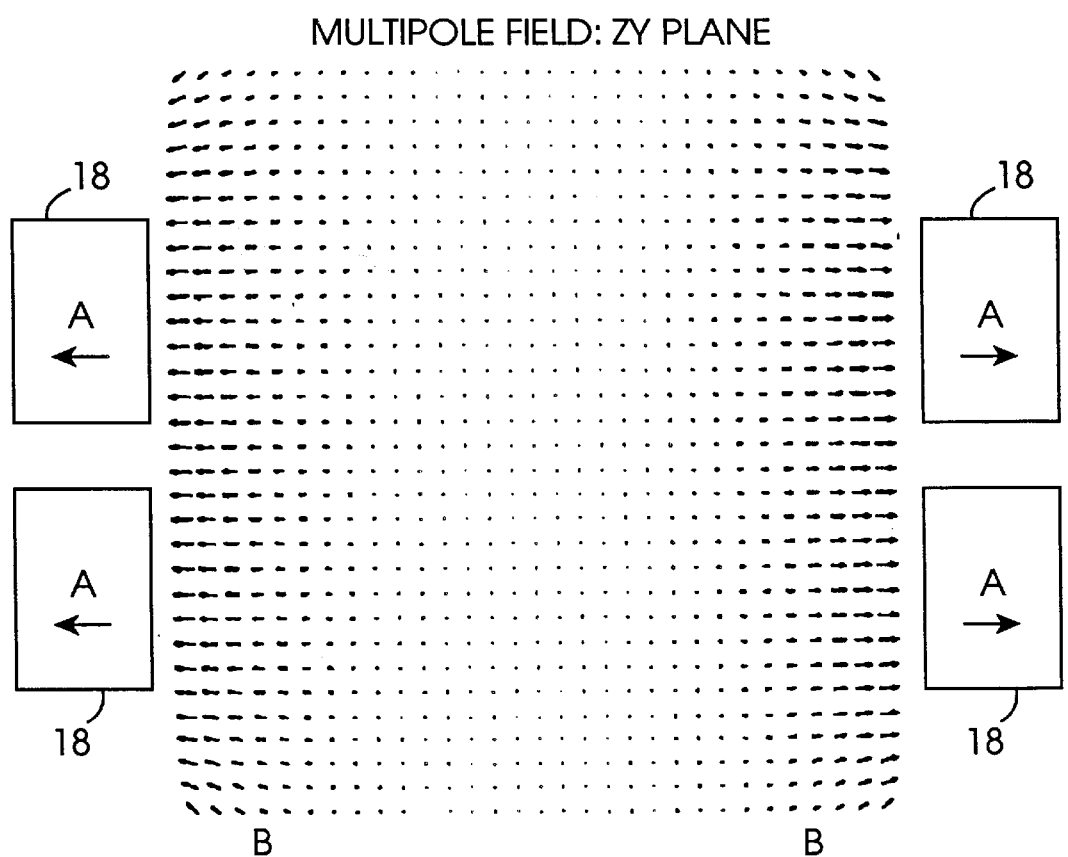
Figure 6B:
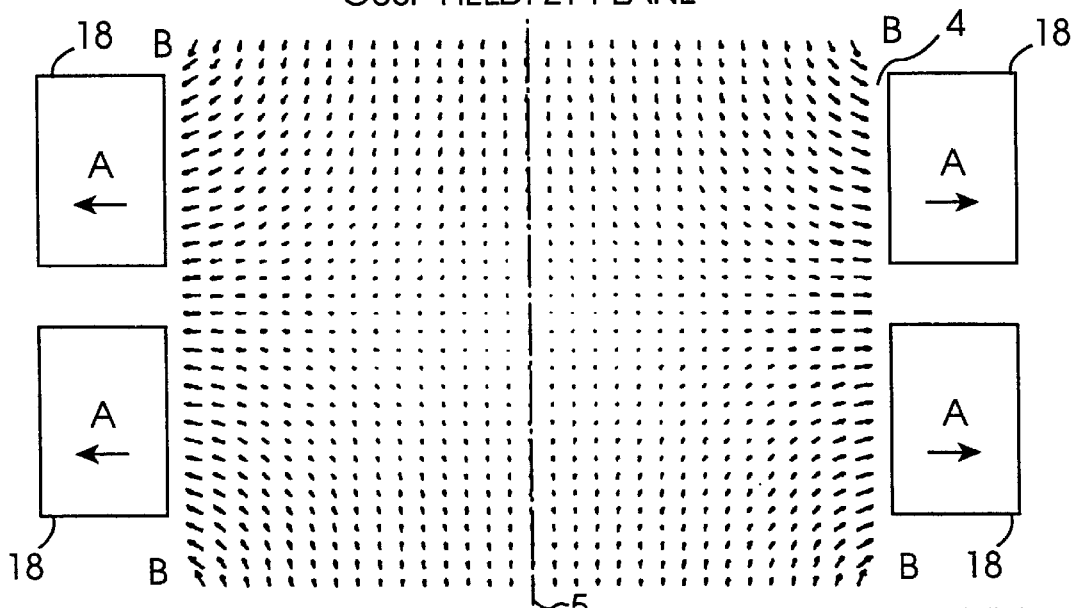

In FIGS. 5(b) and 6(b) a cusp composite magnetic field is generated. In order to achieve the cusp composite magnetic field the permanent magnets 18 of each aligned pair are oriented with their respective directions of magnetisation extending in the same directions, see FIG. 6(b). The magnetic flux of the cusp composite magnetic field flows radially outwardly from the main central axis 5 towards the permanent magnets 18 of the top and bottom ring members 2 and 3.

In FIGS. 5(c) and 6(c) a hexapole composite magnetic field is generated in the central area 4. In order to generate the hexapole composite magnetic field of FIGS. 5(c) and 6(c) the permanent magnets 18 of each aligned pair are oriented with their respective directions of magnetisation extending in the same respective directions, see FIG. 6(c). The direction of the magnetic flux in the hexapole composite magnetic field is illustrated by the arrows B.

Figure 6E:
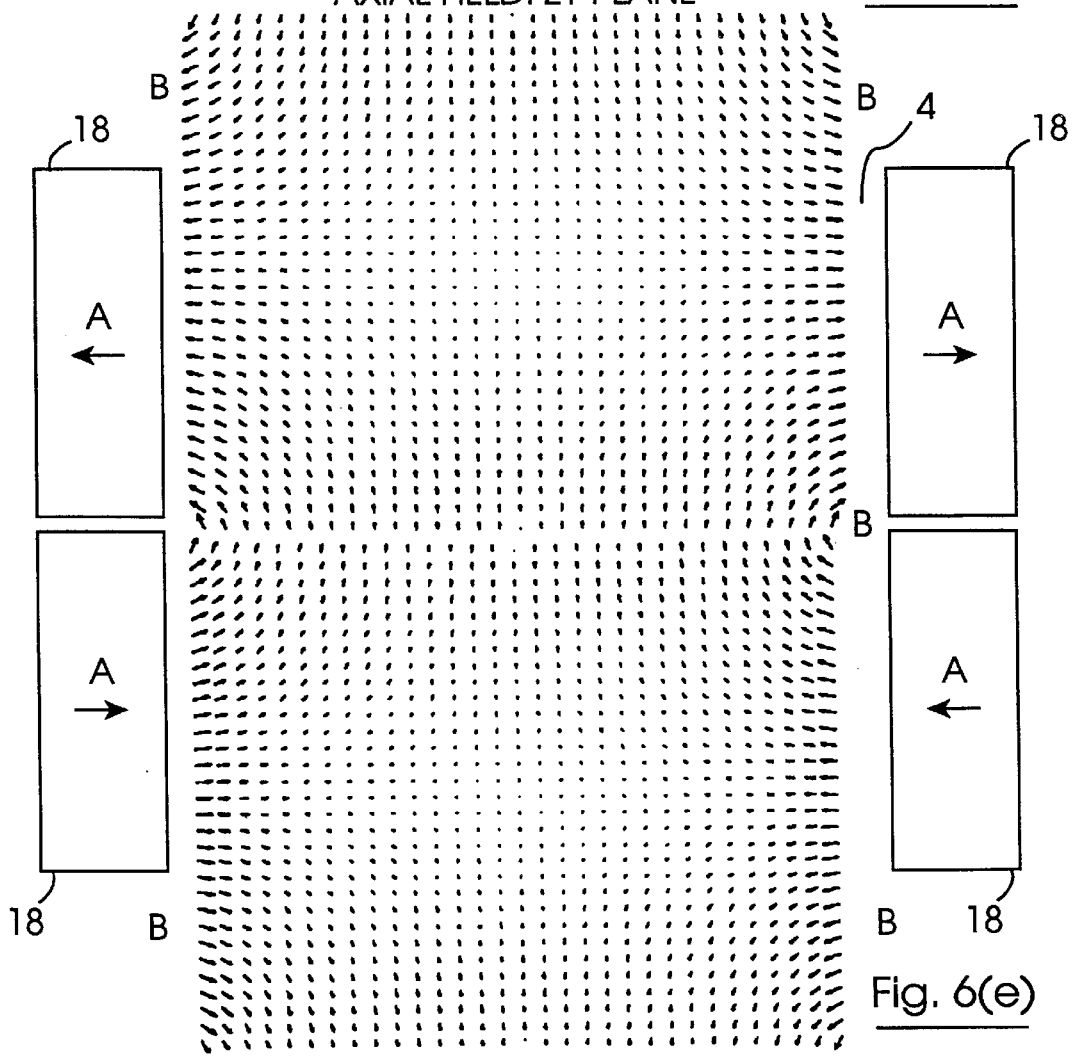
Figure 6D:
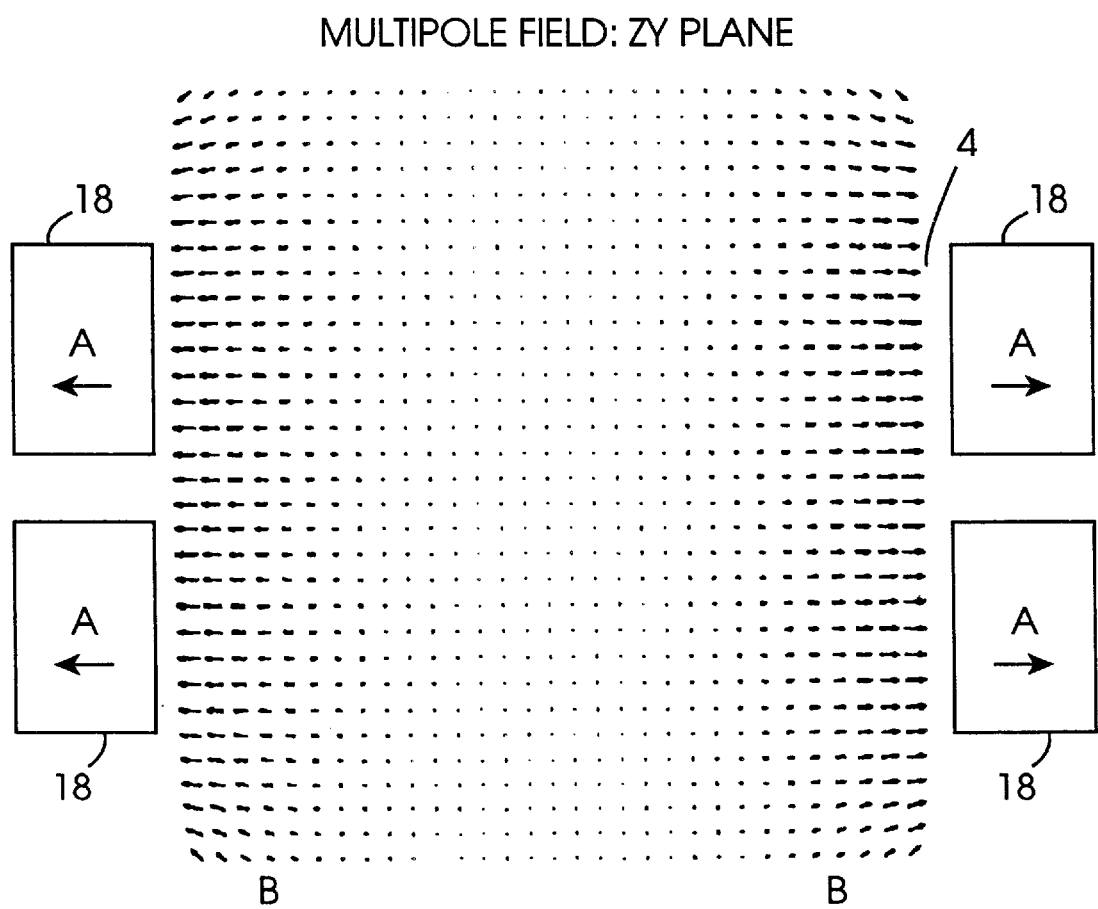

In FIGS. 5(d) and 6(d) a quadrupole composite magnetic field is generated. In order to achieve the quadrupole composite magnetic field the permanent magnets 18 of each aligned pair are oriented with their respective directions of magnetisation extending in the same directions, see FIG. 6(d). Depending on the orientation of the direction of magnetisation of the respective permanent magnets 18 in the top and bottom ring members 2 and 3, the magnetic flux will flow in a substantially similar manner as described with reference to FIGS. 5(c) and 6(c), with the exception that instead of a six pole field being generated a four pole field is generated.

Referring now to FIG. 6(e), an alternative cusp composite magnetic field which is generated by the device 1 is illustrated. In order to achieve the composite cusp magnetic field of FIG. 6(e), the permanent magnets 18 in the bottom ring 3 are rotated through 180° so that their respective directions of magnetisation extend in directions diametrically opposed to the direction of magnetisation of their corresponding aligned permanent magnet 18 in the top ring member 2. In this composite cusp magnetic field, the magnetic flux flows from the permanent magnets in the bottom ring member 3 axially inwardly towards the central axis 5, and then axially upwardly parallel to the main central axis 5, and then in turn axially outwardly towards the permanent magnets 18 in the top ring member 2. The composite cusp magnetic field generated by this orientation of the permanent magnets 18 in the top and bottom ring members 2 and 3 in plan view is similar to that illustrated in FIG. 5(b).

The strength of the composite magnetic cusp fields illustrated in FIGS. 5(b), 6(b) and 6(e) may be varied by incrementing the angular orientation of the respective permanent magnets 18 of the top and bottom ring members 2 and 3. Maximum strength of field is obtained when the permanent magnets 18 are oriented with their respective directions of magnetisation extending in a direction radially relative to the main central axis 5. Minimum strength of the magnetic fields is obtained when the permanent magnets 18 of the top and bottom ring members 2 and 3 are oriented with their respective directions of magnetisation extending in a direction circumferentially around the main central axis 5. To vary the strength of the composite dipole magnetic field of FIGS. 5(a) and 6(a), alternate permanent magnets 18 around the pitch circle 21 are oriented in one direction while the rest are oriented in the opposite direction. When adjacent permanent magnets 18 are oriented with their directions of magnetisation extending in substantially similar directions the strength of the composite magnetic field is maximised. When adjacent permanent magnets 18 are oriented with their directions of magnetisation extending in diametrically opposite directions, the strength of the composite magnetic field is at a minimum.

Figure 7:
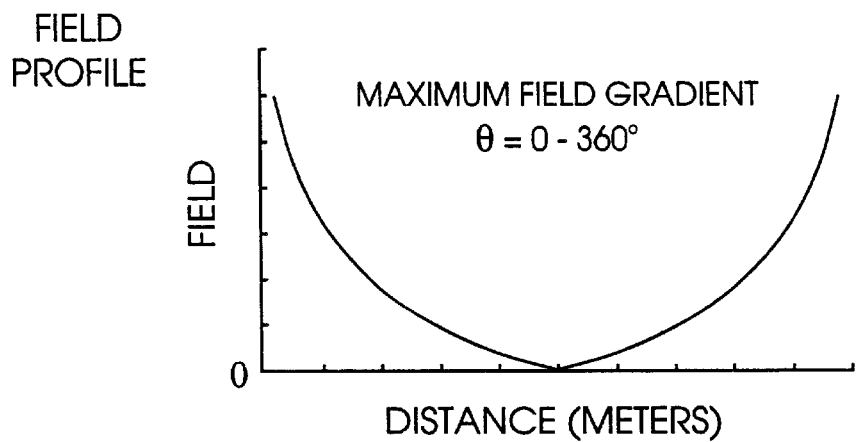
FIG. 7 is a graphical representation of the gradient of the magnetic field generated in FIGS. 5(b) and 6(b) by the device of FIG. 1 on the line VI—VI of FIG. 5(b)

Referring now to FIG. 7 the gradient of the maximum strength of the composite cusp field which is generated on the line VI—VI of FIG. 5(b) by the device 1 when the permanent magnets 18 of the top and bottom ring members 2 and 3 are oriented as illustrated in FIGS. 5(b) and 6(b).

Figure 8:
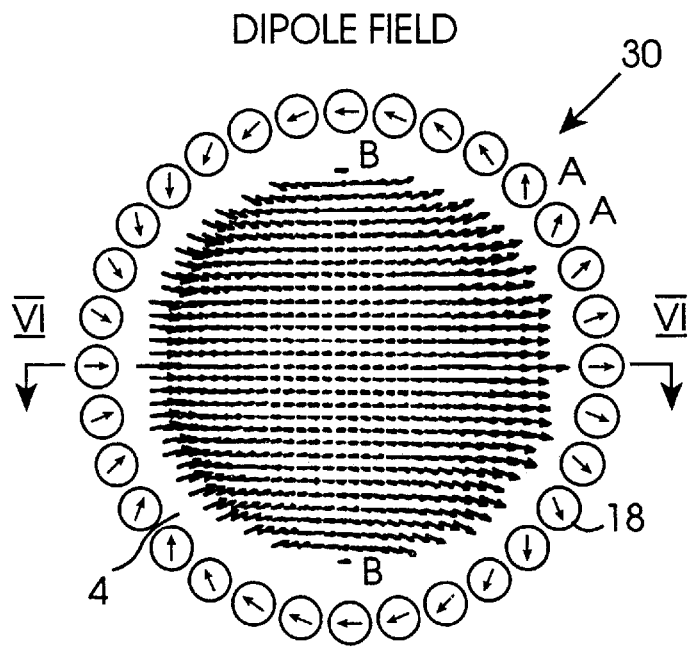
FIG. 8 is a view similar to FIG. 5(d) of a device according to another embodiment of the invention for generating a variable composite magnetic field.

Referring now to FIG. 8 there is illustrated a diagrammatic representation of a device according to another embodiment of the invention indicated generally by the reference numeral 30 also for generating a composite magnetic field. The device 30 is substantially similar to the device 1, and similar components are identified by the same reference numerals. The main difference between the device 30 and the device 1 is that the device 30 only comprises a single ring member, in other words, the ring member 2 of permanent magnets 18. Thus, in this embodiment of the invention the composite magnetic field is generated in x-axis and y-axis directions, while the composite magnetic fields generated by the device 1 can be a composite magnetic field generated in x-axis, y-axis and z-axis directions, the z-axis direction being parallel to the main central axis 5. In FIGS. 5(b) and (e) and 6(b) and (e) the composite magnetic fields are generated in the three axes directions, namely, in x-axis, y-axis and z-axis directions, the z-axis direction being parallel to the main central axis 5.

In use, the device 1 for generating the variable composite magnetic field is located around a furnace so that the top and bottom ring members 2 and 3 extend around the furnace. In other words the furnace is located within the central area 4. The melt from which the semiconductor crystals are to be grown is retained in a melt state within the furnace and the appropriate composite magnetic field suitable for growing the semiconductor crystal is generated by the device 1. The stepper motors 22 are operated for orienting the corresponding permanent magnets 18 of the top and bottom ring members 2 and 3 in order to generate the desired composite magnetic field in the central area 4. The control circuitry (not shown) reads the outputs from the encoders 24 for determining when the permanent magnets 14 have been oriented into the appropriate orientations. As the process for growing the single crystal semiconductor material progresses should it be desired to alter the type and direction of the composite magnetic field, the stepper motors 22 are again operated under the control of the control circuitry (not shown) for again orienting the permanent magnets 18 into the appropriate new orientations. Table 1 gives an example of the transverse composite magnetic fields B which would be produced at the central axis 5 in the main central area 4 of a device comprising one single ring member having N permanent magnets 18 equi-spaced around the pitch circle 21. The permanent magnets 18 are of the same length L and located on a pitch circle R. The field scales with the remanence of the magnetic material of which the permanent magnets are made, in this example is taken to be 1.0 Tesla a value typical of a high-coercivity rare-earth magnet.

TABLE 1

| N | L/R | B(mT) | L/R | B(mT) |
|---|---|---|---|---|
| 8 | 0.1 | 32 | 1.0 | 300 |
| 12 | 0.1 | 21 | 1.0 | 200 |
| 16 | 0.1 | 15 | 1.0 | 140 |
| 24 | 0.1 | 10 | 1.0 | 95 |
| 48 | 0.1 | 5 | 1.0 | 50 |
| 96 | 0.1 | 2 | 1.0 | 24 |

Figure 9:
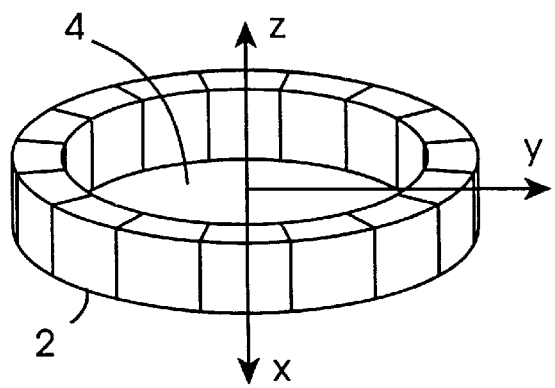
FIG. 9 is a diagrammatic perspective view of a device similar to the device of FIG. 1.
Figure 10:
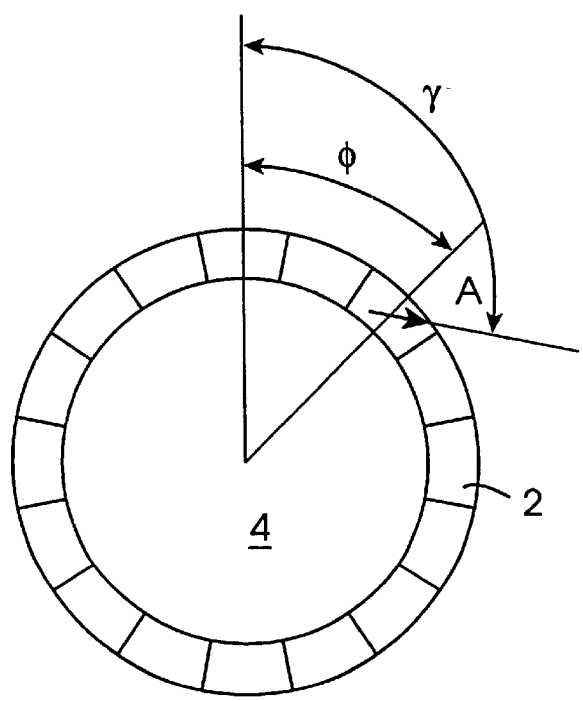
FIG. 10 is a diagrammatic plan view of the device of FIG. 9.

Referring to FIGS. 9 and 10 the orientation of the magnetisation of a symmetrical ring-like magnetic structure is determined by the formula $\gamma=n\phi$. Such a structure is constructed using an array of an even number of permanent magnets similar to the permanent magnets 18, arranged with their respective secondary axes parallel to the main central axis 5 and lying on a common pitch circle.

When such a ring-like magnet structure is used with an appropriate furnace located in the central area 4 for growing silicon crystals, the magnetic field in the central area 4 is characterised by a general rule such that to generate a $2^{n-1}$ pole field the angles must be set to $\gamma=n\phi$ with reference to FIGS. 9 and 10. A cusp field requires n=1, a dipole field requires n=2, a quadrupole fields requires n=3, a hexapole field requires n=4, an octopole field requires n=2, etc. The orientations of some of these multipole field patterns are illustrated in FIGS. 5(a) to (d) and 6(a) to (d) as discussed above. These field patterns may be rotated in the X-Y plane by rotating the permanent magnets 18 together in phase with each other so that they maintain the same relative orientations. A field gradient in the horizontal X-Y plane of the device is created by the configuration shown in FIGS. 5(b) and 6(b) as illustrated in FIG. 7.

While the top and bottom ring members have been described as abutting each other, it is envisaged in certain cases that the ring members may be axially spaced apart from each other, and in which case, the length of the magnetic field generated in the z-axis direction parallel to the main central axis would be longer.

While the magnetic field generating means have been described as being rod-shaped permanent magnets, any other suitable magnetic field generating means may be provided. Needless to say, the shape of the magnets may vary and it is envisaged that the magnets instead of being arranged with their longitudinal axis extending vertically, the permanent magnets may be arranged with their longitudinal axis extending horizontally, or in other words, extending in a plane perpendicularly to the main central axis of the device, and in which case the magnets would be magnetised in a direction either parallel to or transversely of the longitudinally extending axis, but in a plane extending perpendicularly to the main central axis.

We claim:

1. A device for generating a variable composite magnetic field, the device comprising a ring member (2,3) defining a main central axis (5) and a central area (4) around the central axis (5) within which the composite magnetic field is generated, a plurality of discrete magnetic field generating means (18) for generating respective magnetic fields mounted at spaced apart intervals around the ring member (2,3) for generating the composite magnetic field in the central area (4), characterised in that the respective magnetic field generating means (18) are orientably mounted on the ring member (2,3) for varying the orientations of the magnetic fields generated by the magnetic field generating means (18) for varying the composite magnetic field, and a means (22) is provided for varying the orientations of the magnetic field generating means (18) and for retaining the magnetic field generating means (18) in desired orientations.

2. A device as claimed in claim 1 characterised in that each magnetic field generating means (18) defines a corresponding secondary axis (19).

3. A device as claimed in claim 2 characterised in that the respective magnetic field generating means (18) are mounted on the ring member (2,3) with their respective secondary axes (19) extending parallel to each other and parallel to the main central axis (5).

4. A device as claimed in claim 2 or 3 characterised in that the respective magnetic field generating means (18) are mounted on the ring member (2,3) with their respective secondary axes (19) located on a common pitch circle (21), the centre of which coincides with the main central axis (5).

5. A device as claimed in any of claims 2 to 4 characterised in that the respective magnetic field generating means (18) are mounted with their secondary axes (19) equi-spaced apart circumferentially around the main central axis (5).

6. A device as claimed in any of claims 2 to 5 characterised in that each magnetic field generating means (18) generates a magnetic field extending transversely of its corresponding secondary axis (19).

7. A device as claimed in any of claims 2 to 5 characterised in that each magnetic field generating means (18) generates a magnetic field extending perpendicularly to its corresponding secondary axis (19).

8. A device as claimed in any of claims 2 to 7 characterised in that each magnetic field generating means (18) is magnetised such that its direction of magnetisation extends transversely of its secondary axis (19).

9. A device as claimed in claim 2 characterised in that each magnetic field generating means (18) is rotatably mounted in about its secondary axis (19) for varying the orientation of the magnetic filed generated by the magnetic field.

10. A device as claimed in claim 2 characterised in that the means (22) for orienting each magnetic field generating means (18) rotates the respective magnetic field generating means (18) about their respective secondary axes (19).

11. A device as claimed in claim 2 characterised in that a plurality of means (22) for orientating the magnetic field generating means (18) are provided, one orientating means (22) being provided for each magnetic field generating means (18).

12. A device as claimed in claim 11 characterised in that each orienting means (22) comprises an electrically powered motor (22).

13. A device as claimed in claim 12 characterised in that each electrically powered motor (22) is a stepper motor (22).

14. A device as claimed in claims 2 characterised in that a monitoring means (24) is provided for determining the angular position of each magnetic field generating means (18) about its secondary axis (19), and the orientating means (22) is responsive to the monitoring means (24) for orienting the magnetic field generating means (18).

15. A device as claimed in claim 14 characterised in that the monitoring means comprises a plurality of angular position determining encoders (24), one encoder (24) being provided for each magnetic field generating means (18).

16. A device as claimed in claim 1 characterised in that said retaining means (22) is provided for retaining each magnetic field generating means (18) in any one of a plurality of orientations.

17. A device as claimed in claim 16 characterised in that a plurality of retaining means (22) are provided, one retaining means (22) being provided associated with each magnetic field generating means (18).

18. A device as claimed in claim 16 characterised in that each retaining means (22) is provided by a stepper motor of the corresponding magnetic field generating means.

19. A device as claimed in claim 1 characterised in that each magnetic field generating means (18) is independently orientatable relative to the other magnetic field generating means (18).

20. A device as claimed in claim 1 characterised in that each magnetic field generating means (18) comprises a permanent magnet (18).

21. A device as claimed in claim 20 characterised in that each permanent magnet (18) is of a high coercivity grade material.

22. A device as claimed in claim 20 characterised in that each permanent magnet (18) is of a rare-earth material.

23. A device as claimed in claim 1 characterised in that each magnetic field generating means (18) is provided by a rod-shaped permanent magnet (18).

24. A device as claimed in claim 23 characterised in that the secondary axis (19) of each rod-shaped permanent magnet (18) is defined by the longitudinal geometrical central axis of the rod-shaped permanent magnet (18).

25. A device as claimed in claim 23 characterised in that each rod-shaped permanent magnet (18) is of circular cross-section.

26. A device as claimed in claim 1 characterised in that at least two ring members (2, 3) are provided, the ring members (2, 3) being co-axially arranged with their respective main central axis (5) coinciding with each other.

27. A device as claimed in claim 26 characterised in that the respective ring members (2,3) are arranged side by side axially along the main central axis (5).

28. A device as claimed in claim 26 characterised in that the respective ring members (2, 3) are of similar diameter.

29. A device a claimed in claim 26 characterised in that the respective ring members (2, 3) are arranged for axially abutting each other.

30. A device as claimed in claim 26 characterised in that the pitch circle (21) diameters of the respective ring members (2, 3) along which the corresponding magnetic field generating means (18) are located are of similar diameter.

31. A device as claimed in claim 26 characterised in that each ring member (2, 3) is of circular shape.

32. A device as claimed in claim 26 characterised in that each ring member (2, 3) comprises at least eight magnetic field generating means (18).

33. A method for generating a variable composite magnetic field using the device (1) as claimed in claim 1 characterised in that the method comprises orientating the respective magnetic field generating means (18) located on said each ring member (2, 3) to an orientation for generating the composite magnetic field of the desired type and direction.

34. A method for growing a semiconductor crystal using the device as claimed in claim 1 characterised in that the crystal being grown is grown in the composite magnetic field.

* * * * *